(12) United States Patent
Jeon et al.

(10) Patent No.: US 12,489,466 B2
(45) Date of Patent: Dec. 2, 2025

(54) ENCODER AND ENCODING METHOD

(71) Applicant: SAMSUNG ELECTRONICS CO., LTD., Suwon-si (KR)

(72) Inventors: Kijun Jeon, Suwon-si (KR); Kyoungbin Park, Suwon-si (KR); Minki Song, Suwon-si (KR); Dongmin Shin, Suwon-si (KR); Daeyeol Yang, Suwon-si (KR); Bohwan Jun, Suwon-si (KR); Youngjun Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/584,838

(22) Filed: Feb. 22, 2024

(65) Prior Publication Data
US 2024/0429943 A1   Dec. 26, 2024

(30) Foreign Application Priority Data
Jun. 21, 2023 (KR) .......... 10-2023-0079913

(51) Int. Cl.
*H03M 13/11* (2006.01)
*H03M 13/00* (2006.01)

(52) U.S. Cl.
CPC ..... *H03M 13/1174* (2013.01); *H03M 13/616* (2013.01); *H03M 13/6516* (2013.01)

(58) Field of Classification Search
CPC ................................ H03M 13/616
See application file for complete search history.

(56) References Cited

U.S. PATENT DOCUMENTS

| | | |
|---|---|---|
| 7,984,364 B2 | 7/2011 | Park et al. |
| 9,444,493 B2 | 9/2016 | Zhang et al. |
| 2004/0153934 A1* | 8/2004 | Jin .............. H03M 13/6362 714/746 |

(Continued)

FOREIGN PATENT DOCUMENTS

| | | |
|---|---|---|
| KR | 10-0975558 | 8/2010 |
| KR | 10-1684157 | 12/2016 |

(Continued)

OTHER PUBLICATIONS

Huang et al., "Linear Time Encoding of Cycle GF(2p) Codes through Graph Analysis, " IEEE Communications Letters, May 2006, 10(5):369-371.

*Primary Examiner* — Joseph D Torres
(74) *Attorney, Agent, or Firm* — Fish & Richardson P.C.

(57) ABSTRACT

An LDPC encoder is described with memory for storing a parity check matrix and a calculation unit to encode information bits into a codeword with reference to the parity check matrix. The parity check matrix includes an information part matrix and a parity part matrix. In the parity part matrix, Z*Z sub-matrices are sub-matrices, other than a zero matrix, and are arranged in each of the m rows and m columns. A sub-matrix is a scaled cyclic matrix obtained by shifting elements of an identity matrix by one to the left and multiplying the shifted elements by a scaling element. Except for the scaled cyclic matrix, the remaining sub-matrices are a zero matrix or an identity matrix, and the scaling element is an element allowing the parity part matrix to satisfy a full rank condition on a Galois field.

10 Claims, 14 Drawing Sheets

(56) References Cited

U.S. PATENT DOCUMENTS

| | | | |
|---|---|---|---|
| 2007/0283219 A1 | 12/2007 | Park et al. | |
| 2009/0063930 A1* | 3/2009 | Matsumoto | H03M 13/116 |
| | | | 714/752 |
| 2012/0023383 A1* | 1/2012 | Maehata | H03M 13/1134 |
| | | | 714/752 |
| 2015/0155884 A1 | 6/2015 | El-Khamy et al. | |
| 2021/0167799 A1 | 6/2021 | Boutillon et al. | |

FOREIGN PATENT DOCUMENTS

| | | |
|---|---|---|
| KR | 10-2343939 | 12/2021 |
| KR | 10-2022-0064187 | 5/2022 |

\* cited by examiner $$H = \begin{bmatrix} \alpha & 0 & 0 & \alpha & \cdots & 0 \\ 0 & \alpha^2 & 0 & 1 & \cdots & 0 \\ \cdot & \cdot & \cdot & \cdot & & \cdot \\ \cdot & \cdot & \cdot & \cdot & & \cdot \\ \cdot & \cdot & \cdot & \cdot & & \cdot \\ \alpha & 0 & \alpha^2 & 0 & \cdots & 1 \end{bmatrix} \Big\} n\text{-}k$$

$\underbrace{\phantom{xxxxxxxxxxxxxxxxx}}_{n}$

FIG. 2

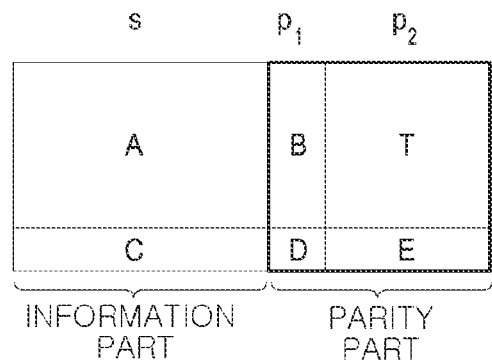
FIG. 5A
FIG. 5B
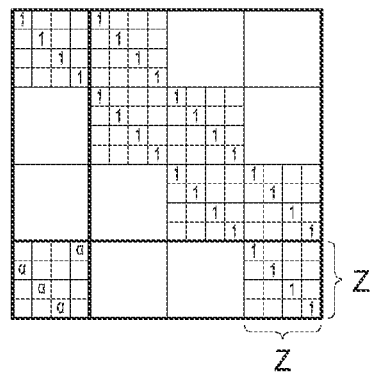
FIG. 5C

ENCODER AND ENCODING METHOD

CROSS-REFERENCE TO RELATED APPLICATION(S)

This application claims benefit of priority to Korean Patent Application No. 10-2023-0079913 filed on Jun. 21, 2023, in the Korean Intellectual Property Office, the disclosure of which is incorporated herein by reference in its entirety.

BACKGROUND

The present disclosure relates to a non-binary quasi-cyclic low-density parity check (LDPC) encoder and a non-binary LDPC encoding method.

An error correction technique referred to as a low-density parity check (LDPC) may be used to correct an error bit of data read from a storage device or an error bit of data received from a communication system. The LDPC is a technique for detecting and correcting errors in data by repeatedly updating connected variable nodes and check nodes. A connection between the variable nodes and the check nodes may be defined by a parity check matrix.

SUMMARY

In general, in some aspects, the subject matter of the present disclosure is directed to LDPC encoders with improved correction capabilities and allowing low complexity operations while maintaining parallel processing performance of a non-binary quasi-cyclic LDPC codes.

In general, in some aspects, the subject matter of the present disclosure is directed to an LDPC encoder that includes: a memory configured to store a parity check matrix; and a calculation unit configured to encode information bits into a codeword with reference to the parity check matrix, wherein the parity check matrix includes: an information part matrix corresponding to an information vector including the information bits, and a parity part matrix corresponding to the parity vector, and wherein in the parity part matrix, Z*Z sub-matrices respectively arranged in m rows and m columns are included (where m and Z are natural numbers), and two sub-matrices, other than a zero matrix, are arranged in each of the m rows and m columns, a sub-block D having a sub-matrix at an mth row and a first column is a scaled cyclic matrix obtained by shifting elements of an identity matrix by one to the left and multiplying the shifting elements by a scaling element other than '0' or '1' of a Galois field, except for the scaled cyclic matrix of the sub-block D, the remaining sub-matrices are a zero matrix or an identity matrix, and the scaling element is an element allowing the parity part matrix to satisfy a full rank condition on the Galois field.

In general, in some aspects, the subject matter of the present disclosure is directed to an LDPC encoder that includes: a first calculation block configured to perform a multiplication of an information vector and an information part matrix having sub-matrices at each of m rows and k columns, in a parity check matrix (where m and k are natural numbers); a second calculation block configured to generate an output vector by adding outputs of each of m rows of the first calculation block; a third calculation block configured to determine a first element of a first parity vector by performing a predetermined sum-product operation on each element of the output vector, perform an operation of determining an ith element of the first parity vector by multiplying an (i−1)th element of the first parity vector by an element α of a Galois field and adding an ith element of the output vector thereto, for a second element to a last element of the first parity vector, respectively, and output a first parity vector constituting a codeword together with the information vector (where i is a natural number), and a fourth calculation block configured to determine a first partial vector of a second parity vector by adding an output of a first row of the first calculation block and an output of the first parity vector, perform an operation of adding an output of a jth row of the first calculation block to a (j−1)th partial vector of the second parity vector, for a second partial vector to a last partial vector of the second parity vector, respectively, and output a second parity vector constituting the codeword (where j is a natural number).

In general, in some aspects, the present disclosure is directed to an LDPC encoding method that includes: in a parity check matrix, performing a multiplication of an information vector and an information part matrix having k sub-matrices at each of m rows (where m and k are natural numbers); generating an output vector by adding results for each of the m rows, included in multiplication results of the information part matrix and the information vector; determining a first element of a first parity vector by performing a predetermined sum-product operation on each of elements of the output vector; performing an operation of determining an ith element of the first parity vector by multiplying an (i−1)th element of the first parity vector by an element α of the Galois field and adding an ith element of the output vector thereto, for a second element to a last element of the first parity vector, respectively (where i is a natural number); determining a first partial vector of a second parity vector by adding an output of a first row of the first calculation block and an output of the first parity vector; performing an operation of adding an output of a jth row of the first calculation block to a (j−1)th partial vector of the second parity vector, for a second partial vector to a last partial vector of the second parity vector (j is a natural number); and outputting the information vector, the first parity vector, and the second parity vector as codewords.

Implementations of the LDPC encoder and LDPC encoding method according to the present disclosure may be used for performing non-binary quasi-cyclic LDPC encoding based on a parity check matrix in which non-zero elements of rows and columns are closely connected to each other in a parity section, thereby providing improved error correction performance along with parallel processing performance.

Implementations of the LDPC encoder and LDPC encoding method according to the present disclosure may include a low complexity non-binary quasi-cyclic LDPC encoding calculation using the regularity of a matrix multiplication of a specific inverse matrix in a parity check matrix.

The aspects to be solved by the present disclosure are not limited to the above-mentioned aspects, and other aspects not mentioned herein will be clearly understood by those skilled in the art from the following description.

BRIEF DESCRIPTION OF THE DRAWINGS

The above and other aspects, features, and advantages of the present disclosure will be more clearly understood from the following detailed description, taken in conjunction with the accompanying drawings, in which:

FIG. 2 is a view illustrating an example of a parity check matrix of a non-binary LDPC code;

FIGS. 5A to 5C are views illustrating an example of a parity check matrix;

DETAILED DESCRIPTION

Hereinafter, example implementations will be described with reference to the accompanying drawings.

Figure 1:
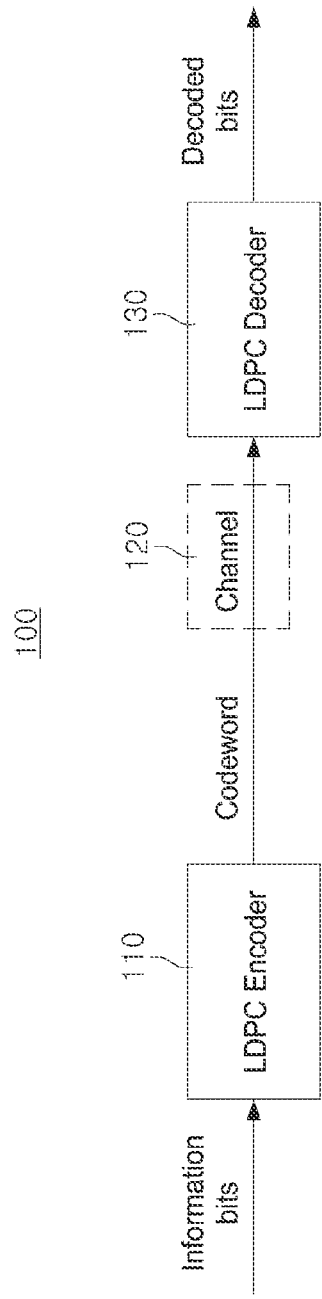
FIG. 1 is a block diagram illustrating an example of a signal transmission system.

FIG. 1 is a block diagram illustrating an example of a signal transmission system.

Referring to FIG. 1, a signal transmission system 100 includes a low-density parity check (LDPC) encoder 110, a channel 120, and an LDPC decoder 130.

The signal transmission system 100 may be a communication system or a storage device. For example, when the signal transmission system 100 is a communication system including a transmitter and a receiver, the LDPC encoder 110 may be included in the transmitter, and the LDPC decoder 130 may be included in the receiver. As another example, when the signal transmission system 100 is a storage device including a storage controller and a nonvolatile memory device, the LDPC encoder 110 and the LDPC decoder 130 may be included in the storage controller.

The LDPC encoder 110 may generate an LDPC codeword including information bits and parity bits by performing LDPC encoding on received information bits. In an example, the LDPC encoder 110 may include a memory for storing a parity check matrix and a calculation circuit for encoding the information bits into the LDPC codeword by adding parity bits to the information bits by referring to the parity check matrix. In an example, the LDPC encoder 110 may include one or more calculation circuits implemented to perform calculations based on a parity check matrix on the information bits.

The codeword output from the LDPC encoder 110 may be transmitted to the LDPC decoder 130 through the channel 120. An error may occur in the codeword while the codeword passes through the channel 120. For example, the channel 120 may be a wired or wireless communication channel, and when the signal transmission system 100 is a storage device, the channel 120 may include a nonvolatile memory device.

The LDPC decoder 130 may detect and correct errors included in the codeword by receiving the codeword from the channel 120 and performing LDPC decoding on the codeword.

The LDPC code is a code defined by a parity check matrix in which most elements have a value of '0' and very few elements have a value other than '0.' Since most elements of the parity check matrix have a value of '0', LDPC encoding based on the parity check matrix may be efficiently performed.

The concept of LDPC is expanding. For example, non-binary LDPC having three or more elements of a Galois field as well as '0' and '1' as values of elements in the parity check matrix may provide superior error correction performance as compared to a binary LDPC. Furthermore, quasi-cyclic LDPC, having a parity check matrix generated by expanding each element of a base matrix to a Z*Z zero matrix or a cyclic substitution matrix, may provide high parallel processing performance.

In order to improve the parallel processing performance of a non-binary LDPC code, a method of expanding the non-binary LDPC code to a quasi-cyclic LDPC code is being considered. The non-binary LDPC code expanded to the quasi-cyclic LDPC code may be referred to as a non-binary quasi-cyclic (NBQC)-LDPC code.

Examples of a parity check matrix for improving calculation complexity of NBQC-LDPC codes having improved error correction performance and improved parallel processing performance, and examples of an LDPC encoder and an LDPC encoding method based on the parity check matrix are disclosed herein.

A parity check matrix of a non-binary LDPC code and a parity check matrix of a NBQC-LDPC code will be described with reference to FIGS. 2 to 4.

FIG. 2 is a view illustrating an example of a parity check matrix of a non-binary LDPC code.

Referring to the example of FIG. 2, a parity check matrix of a (n, k) code is defined as a parity check matrix H having a size of (n−k)*n (where n and k are natural numbers).

Each element of the parity check matrix H may be represented by elements belonging to a Galois field GF(q). In the GF(q), q represents an order of the Galois field and may be q=$2^p$. The Galois field GF(q) is a finite element comprised of q elements, and the elements of the Galois field GF(q) may be expressed as $\{0, \alpha^0, \alpha^1, \ldots, \alpha^{q-2}\}$. When the number of non-zero elements ($\alpha^0, \alpha^1, \ldots \alpha^{q-2}$) included in the parity check matrix H is relatively very small compared to the number of zero elements ('0'), the (n, k) code may be defined as a (n, k) non-binary LDPC code. The non-binary LDPC code may be encoded and decoded based on a sum-product operation defined in the Galois field GF(q).

Figure 3:
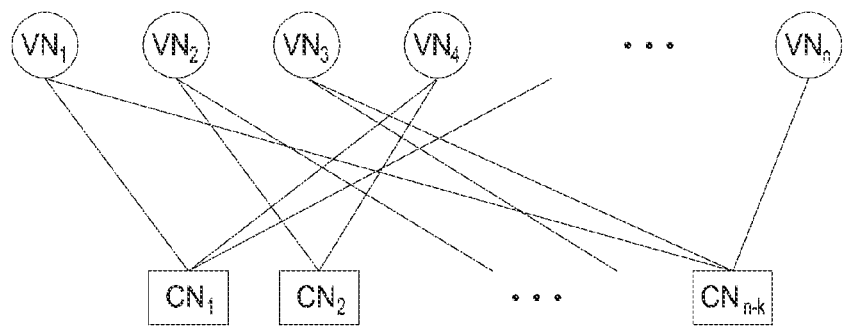
FIG. 3 is a view illustrating the parity check matrix illustrated in FIG. 2 as a Tanner graph.

FIG. 3 is a view illustrating the parity check matrix illustrated in FIG. 2 as a Tanner graph.

Referring to FIG. 3, a Tanner graph includes check nodes, variable nodes, and edges. Each of the edges connects one check node and one variable node, and may correspond to an entry expressed as an element other than '0' in a parity check matrix.

The parity check matrix of the (n, k) code may be represented by a Tanner graph including n−k check nodes CN1-CNn−k and n variable nodes VN1-VNn. A line for connecting the check nodes CN1-CNn−k and the variable nodes VN1-VNn represents the edge.

A non-binary LDPC code may be decoded by performing repeated decoding. The repeated decoding may be performed according to a repeated message transmission algorithm between the check nodes CN1-CNn−k and the variable nodes VN1-VNn on the Tanner graph. That is, the repeated decoding may be performed by transmitting Check node to Variable node (C2V) messages and Variable node to Check node (V2C) messages between the check nodes CN1-Cn–k and the variable nodes VN1-VNn for each repetition. The variable nodes may perform error correction using the C2V messages received from check nodes connected to the variable nodes themselves, and the check nodes can perform a checking operation using the V2C messages received from the variable nodes connected to the check nodes themselves.

When a value is only zero as a result of an exclusive OR (XOR) calculation of values of all variable nodes connected to one of the check nodes, the check node may be determined to be satisfied. On the other hand, when the value as a result of the XOR calculation of values of all variable nodes connected to one of the check nodes includes a non-zero element, the corresponding check node may be determined to be dissatisfied.

Meanwhile, a non-binary LDPC code may have improved error correction performance as compared to a binary LDPC code. Specifically, the non-binary LDPC code may have improved error correction performance in a short-length codeword. For example, an error rate in a waterfall region and an error floor region of a frame error rate curve of the non-binary LDPC code may be improved.

The parity check matrix of the non-binary LDPC code may be expanded into a quasi-cyclic structure, thereby designing a parity check matrix of an NBQC-LDPC code.

Figure 4:
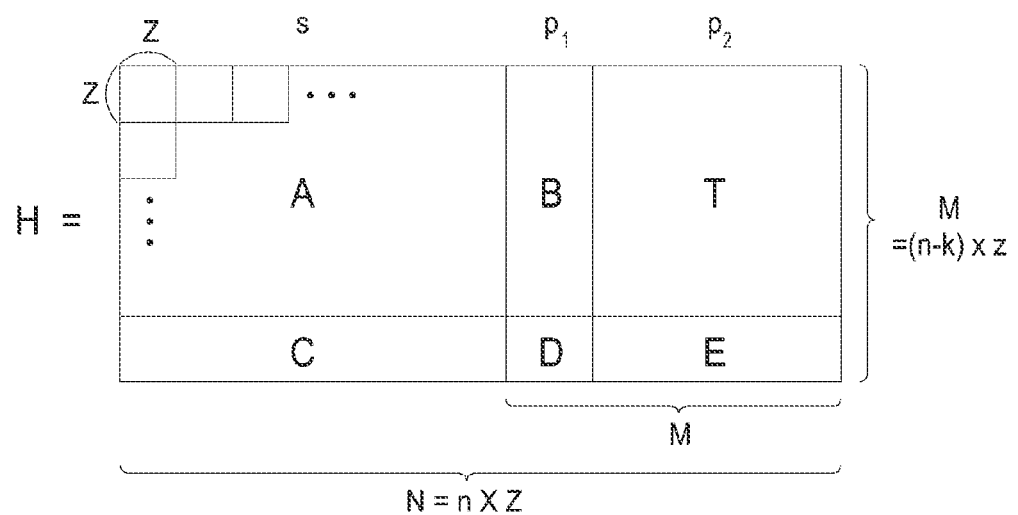
FIG. 4 is a view schematically illustrating an example of structure of a parity check matrix of an NBQC-LDPC code.

FIG. 4 is a view schematically illustrating a structure of an example of a parity check matrix of an NBQC-LDPC code.

Referring to FIG. 4, a parity check matrix H of a (n, k) code is defined as a parity check matrix having a size of (n–k)*N. Hereinafter, it is defined as (n–k)=M. The parity check matrix H of FIG. 4 may be generated by expanding the parity check matrix of the non-binary LDPC code having a size of (n–k)*n described in FIG. 2 (n, k, and M are natural numbers).

The parity check matrix H of the NBQC-LDPC code may be defined as a parity check matrix of the non-binary LDPC code, that is, a matrix in which each element of a base matrix is expanded into a sub-matrix having the size of Z*Z (where Z is a natural number). For example, an element having a value of '0' in the base matrix may be expanded into a zero matrix having the size of Z*Z, and an element having a value other than '0' in the base matrix may be extended to a matrix in which each element in a cyclic identity matrix having the size of Z*Z is scaled to a value of an element in the base matrix.

Encoding and decoding calculations for each of the elements of the sub-matrix in the parity check matrix of the NBQC-LDPC code may be divided into independent unit calculations, and unit calculations may be processed in parallel. Accordingly, the NBQC-LDPC code may have improved error correction performance while improving parallel processing performance.

On the other hand, it may be difficult to design the parity check matrix of the NBQC-LDPC code to enable low complexity encoding while maintaining parallel processing performance and improved error correction ability.

The non-binary LDPC code may be encoded in a Richardson-Urbanke (RU) encoding scheme. In order to perform RU encoding, the non-binary LDPC code may be divided into an information vector s, a first parity vector $p_1$ and a second parity vector $p_2$, and the parity check matrix H may be divided into a plurality of sub-blocks A, B, T, C, D and E. Given the parity check matrix H and an information vector s, encoding of the non-binary LDPC code may be performed by determining parity vectors $p_1$, $p_2$ satisfying the following Equation 1.

$$Hx = \begin{bmatrix} A & B & T \\ C & D & E \end{bmatrix} \begin{bmatrix} s \\ p_1 \\ p_2 \end{bmatrix} = 0 \quad \text{<Equation 1>}$$

In Equation 1, X may refer to a codeword vector.

If Equation 1 is summarized for a first parity vector $p_1$ and a second parity vector $p_2$, the first parity vector $p_1$ and the second parity vector $p_2$ may be expressed as the following Equation 2.

$$\begin{cases} p_1 = \phi^{-1}(ET^{-1}A + C), \phi = ET^{-1}B + D \\ p_2 = T^{-1}(As + Bp_1) \end{cases} \quad \text{<Equation 2>}$$

Referring to Equation 2, the first parity vector $p_1$ and the second parity vector $p_2$ may be represented by calculations of the sub-blocks A, B, T, C, D and E and the information vector s.

The parity check matrix H of the NBQC-LDPC code may be a sparse matrix having an element having a value other than '0,' and the sub-blocks may also be sparse matrices. Furthermore, the sub-matrix constituting the sub-blocks may be comprised of a cyclic substitution matrix or a zero matrix. Accordingly, the calculation complexity of a simple sum-product operation of the sub-blocks may be low.

However, an inverse matrix of a sparse matrix may generally be a dense matrix having an element having a value other than '0.' Since the operation to obtain the first parity vector $p_1$ and the second parity vector $p_2$ involves an inverse matrix multiplication of the sparse matrix, the complexity of an NBQC-LDPC encoding calculation may be increased.

Meanwhile, in order to design the parity check matrix H so that inverse matrices $T^{-1}$ and $\phi^{-1}$ used in the NBQC-LDPC encoding calculation have a structure easy enough to perform the inverse matrix multiplication, the error correction ability of the NBQC-LDPC code may have to be sacrificed. That is, the error correction ability of the NBQC-LDPC code and the complexity of the calculation may have a trade-off relationship.

According to some implementations, a parity check matrix is proposed to reduce the complexity of the NBQC-LDPC encoding calculation while improving the error correction ability of the NBQC-LDPC code.

FIGS. 5A to 5C are views illustrating an example of a parity check matrix.

Referring to FIG. 5A, a parity check matrix H of an NBQC-LDPC code includes an information part and a parity part. The parity part may include sub-blocks B, T, D and E.

As described above, the parity check matrix H of the NBQC-LDPC code may be generated by expanding the base matrix, which is the parity check matrix of the non-binary LDPC code. For example, the parity part of the base matrix may include sub-blocks $B^b$, $T^b$, $D^b$, $E^b$. In some implementations, the sub-blocks are defined as the following Equation 3.

$$\begin{cases} B^b = (1_z(1))^T \\ E^b = 1_z(Z) \\ D^b = 1 \\ T^b = [t^b_{i,j}]^{M-1,M-1}_{i=1,j=1} \text{ where } t^b_{i,j} = \begin{cases} 1, \text{ if } j = i \text{ or } i-1 \text{ for } i = 1, \ldots, M-1, \\ 0, \text{ else,} \end{cases} \end{cases}$$ <Equation 3>

In Equation 3, $B^b=(1_z(1))^T$ may be a one-hot column vector in which a first entry has a value of '1', and $E^b=1_z(Z)$ may be a one-hot low vector in which a Z-th entry, that is, a last entry, has a value of '1'. Furthermore, $T^b$ may be a double diagonal matrix.

The sub-blocks B, T, D and E included in the parity part of the parity check matrix in which the base matrix is expanded may be defined as the following Equation 4.

$$\begin{cases} T_{i,j} = \begin{cases} (0, 1), \text{ if } t^b_{i,j} = 1, \\ (-1, 0), \text{ else,} \end{cases} \\ E_{i,j} = \begin{cases} (0, 1), \text{ if } e^b_{i,j} = 1, \\ (-1, 0), \text{ else,} \end{cases} \\ B_{i,j} = \begin{cases} (0, 1), \text{ if } b^b_{i,j} = 1, \\ (-1, 0), \text{ else,} \end{cases} \\ D = (1, \alpha) \end{cases}$$ <Equation 4>

In Equation 4, (a, b) may refer to a scaled cyclic identity matrix obtained by cyclically shifting a Z*Z identity matrix to the left by a and then replacing an element '1' with a symbol $b \in GF(Q)$. For example, (0, 1) may refer to a Z*Z identity matrix, and (−1, 0) may refer to a Z*Z zero matrix. Furthermore, (1, α) may refer to a scaled Z*Z cyclic identity matrix obtained by shifting elements of the Z*Z identity matrix to the left by 1, and then multiplying the shifted elements by 'α.'

FIG. 5B illustrates sub-matrices constituting the parity part of the parity check matrix, and FIG. 5C illustrates elements constituting the parity part of the parity check matrix. FIG. 5C illustrates a case where Z=4. However, the present disclosure is not limited to the case where Z=4, and Z may have various values such as 64 and 256.

Referring to FIG. 5B and FIG. 5C, in the parity check matrix of the NBQC-LDPC code, a sub-block B may be comprised of a column having a plurality of sub-matrices, a first sub-matrix of the column may be a Z*Z identity matrix, and the remaining sub-matrices may be Z*Z zero matrices. Furthermore, a sub-block E may be comprised of rows having a plurality of sub-matrices, a last sub-matrix of the row may be a Z*Z identity matrix, and the remaining sub-matrices may be Z*Z zero matrices. The sub-block T may have (n−k−1)*(n−k−1) sub-matrices, the Z*Z identity matrix may be arranged in a double diagonal structure, and the sub-matrices excluding the Z*Z identity matrix may be Z*Z zero matrices. Furthermore, a sub-block D may be comprised of a scaled Z*Z cyclic identity matrix obtained by shifting elements of the Z*Z identity matrix to the left by 1 and then multiplying the shifted elements by 'α.'

In some implementations, the parity check matrix described with reference to FIGS. 5A to 5C provides high error correction performance due to improved cycle characteristics. Furthermore, a multiplication of inverse matrices ($T^{-1}$ and $\phi^{-1}$) used in an NBQC-LDPC encoding calculation has a certain pattern, thereby reducing the calculation complexity.

Hereinafter, referring to FIGS. 6A to 7B, cycle characteristics of an example of a parity check matrix will be described in detail. Furthermore, referring to FIGS. 8 to 10, the complexity of an LDPC encoding calculation based on an example of a parity check matrix will be described.

Figure 6A:
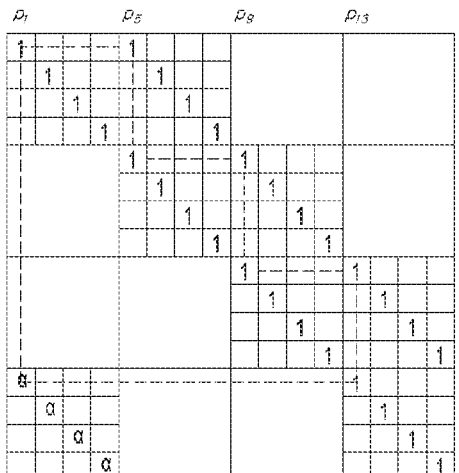
FIGS. 6A to 6C are views illustrating an example of a comparison between cycle characteristics of parity check matrices.
Figure 6B:
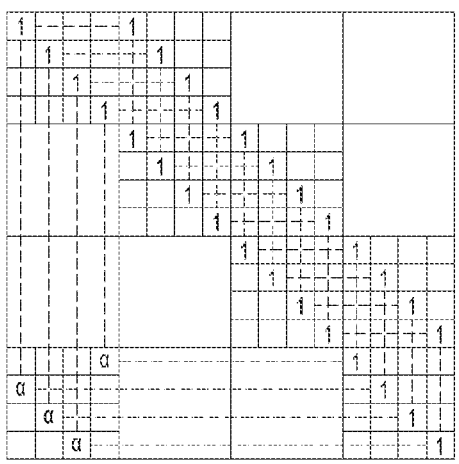
Figure 6C:
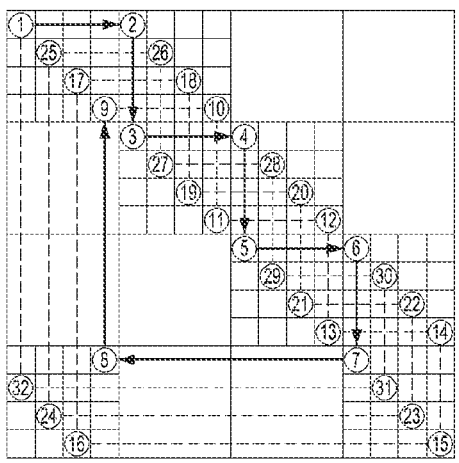

FIGS. 6A to 6C are views for comparing and explaining cycle characteristics of an example of a parity check matrix.

In an LDPC code, cycle characteristics may indicate a degree to which check nodes and variable nodes included in a Tanner graph are closely related to each other. Specifically, when each of the variable nodes corresponding to the parity vector is connected to each other through check nodes without exception, the cycle characteristics may be improved, and the LDPC code may have improved error correction performance.

On the other hand, when there are variable nodes that are not indirectly connected to each other among the variable nodes corresponding to the parity vector in the Tanner graph, the error correction performance may be inferior to a total codeword length obtained by performing LDPC encoding.

FIG. 6A illustrates an example of a parity part matrix of a parity check matrix, and FIG. 6B illustrates an example of a parity part matrix of a parity check matrix.

Unlike the parity part matrix of FIG. 6A, the parity part matrix of FIG. 6B may have a Z*Z equality matrix in which each element of an identity matrix is scaled to 'α' as the sub-block D. The parity part matrix of FIG. 6A may be a matrix designed such that the matrix $T^{-1}$ described above has a lower triangular structure and the matrix $\phi^{-1}$ becomes a scaled Z*Z equal matrix. That is, the parity part matrix of FIG. 6A may be a matrix designed to reduce the complexity of an inverse matrix multiplication of NBQC-LDPC encoding.

A parity check matrix having a parity part matrix designed to reduce the calculation complexity of the NBQC-LDPC encoding may have poor cycle characteristics and poor error correction performance. Whether each of the variable nodes is connected to each other through check nodes in the parity part matrix may be determined based on a cycle formed by connecting non-zero elements in the same row and non-zero elements in the same column in the parity part matrix.

Referring to FIG. 6A, one of cycles formed by connecting elements other than '0' to each other is illustrated. In FIG. 6A, a cycle is illustrated as a broken line. The cycle exemplarily illustrated in FIG. 6A may include only some parity bits ($p_1$, $p_5$, $p_9$, $p_{13}$) of 16 parity bits. The parity bits ($p_1$, $p_5$, $p_9$, $p_{13}$) may be connected to each other through the check nodes, but may not be indirectly connected to the remaining parity bits. The parity part matrix of FIG. 6A may include four cycles independent of each other. The fact that the parity part matrix includes four cycles denotes that the LDPC code has four parity vectors including parity bits independent of each other.

On the other hand, referring to FIG. 6B, elements having a value other than '0' in the parity part matrix according to some implementations may constitute one cycle. The fact that the parity part matrix includes one cycle denotes that all parity bits are closely related to each other in one LDPC code. Cycle characteristics of the parity part matrices illustrated in FIGS. 6A and 6B may be different from each other, and thus error correction performance of the parity check matrices disclosed herein may be different from each other.

On the other hand, the present specification mainly describes an example of a scaled Z*Z cyclic identity matrix obtained by multiplying the sub-block D by the element 'α' of the Galois field, but the present disclosure is not limited thereto. For example, the sub-block D may be multiplied by any element for allowing the parity part matrix to satisfy a Full Rank Condition on the Galois field. Hereinafter, an element that may be multiplied by the sub-block D may be referred to as a scaling element.

FIG. 6C is a view illustrating a full rank condition of a parity part matrix.

In general, a rank of a matrix may refer to a maximum number of rows or columns that are linearly independent of the matrix, and a full rank matrix may refer to a matrix in which all rows and all columns are linearly independent of each other. The fact that a matrix satisfies the full rank condition on a Galois field may denote that all rows cannot be represented as linear combinations of other rows even by calculations defined in the Galois field, and all columns cannot be represented as primary combinations of other rows even by calculations defined in the Galois field.

Whether the parity part matrix as illustrated in FIG. 6B satisfies the full rank condition may be checked using the cycle of the parity part matrix. Specifically, elements having a value other than '0' in the parity part matrix may have a predetermined order within the cycle. FIG. 6C illustrates the order of elements constituting the cycle from '1' to '32.'

When the parity part matrix satisfies the full rank condition, a first addition calculation result of odd-numbered elements among the elements constituting the cycle may be different from a second addition calculation result of even-numbered elements. Here, the addition calculation may refer to an addition calculation defined in the Galois field.

In some implementations, among elements $\alpha^1, \alpha^2, \ldots, \alpha^{q-2}$ other than '0' or '1' among the elements of the Galois field GF(q), an element that makes a first addition result different from a second addition result may be multiplied by the sub-block D as a scaling element.

Figure 7A:
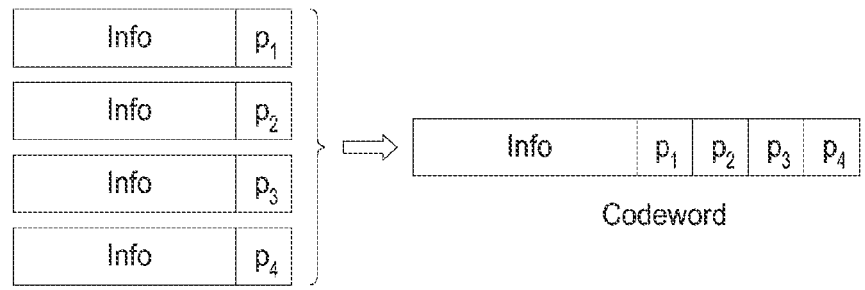
FIGS. 7A and 7B are views illustrating an example of a comparison between error correction performance of parity check matrices.
Figure 7B:
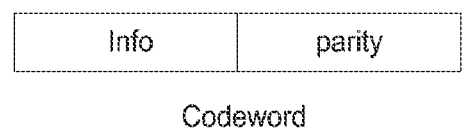

FIGS. 7A and 7B are views illustrating examples of a comparison between error correction performance of parity check matrices.

FIG. 7A illustrates an exemplary codeword generated based on the parity check matrix according to the comparative example described with reference to FIG. 6A. A codeword illustrated in FIG. 7A may include an information vector Info and four parity vectors $p_1, p_2, p_3, p_4$. The four parity vectors $p_1, p_2, p_3, p_4$ may include parity bits that are not indirectly connected to each other, and the four parity vectors $p_1, p_2, p_3, p_4$ may be calculated independently of each other.

That is, the codeword illustrated in FIG. 7A may have a structure in which a plurality of codewords generated by performing different LDPC encoding on one information vector Info are connected in parallel. Since the codeword illustrated in FIG. 7A is only a codeword in which codewords having a relatively short code length are connected in parallel, error correction performance may be reduced in terms of the codeword length.

FIG. 7B illustrates a codeword generated based on a parity check matrix according to some implementations described with reference to FIG. 6B. The codeword illustrated in FIG. 7B may include an information vector Info and a parity vector Parity. Parity bits included in the parity vector Parity may be parity bits connected to each other through check nodes. That is, the parity bits may be closely related to each other. When a length of the information vector and a length of the codeword in FIG. 7A and FIG. 7B are identical to each other, the error correction performance of FIG. 7B may be improved.

In short, in some implementations, a sub-block D is designed as a matrix obtained by shifting a Z*Z identity matrix scaled to 'α' to the left by 1 so that elements having a value other than '0' are closely connected to each other in row and column directions in a parity check matrix of an NBQC-LDPC code. In some implementations, error correction performance of the NBQC-LDPC code using the parity check matrix may be improved.

Meanwhile, the complexity of an NBQC-LDPC encoding calculation using the parity check matrix may also be reduced.

The NBQC-LDPC encoding calculation may include a calculation of obtaining values of elements of the parity vectors ($p_1$, $p_2$) described with reference to FIG. 4. The calculation of obtaining values of elements of parity vectors ($p_1$, $p_2$) may be explained by solving a plurality of linear simultaneous equations derived by performing the sum-product operation of matrices and vectors illustrated in Equation 2 described above.

In some implementations, a matrix multiplication of an inverse matrix (e.g., $T^{-1}$, $\phi^{-1}$) generated based on the parity check matrix has a certain pattern, thereby reducing the complexity of the NBQC-LDPC encoding calculation.

Figure 8:
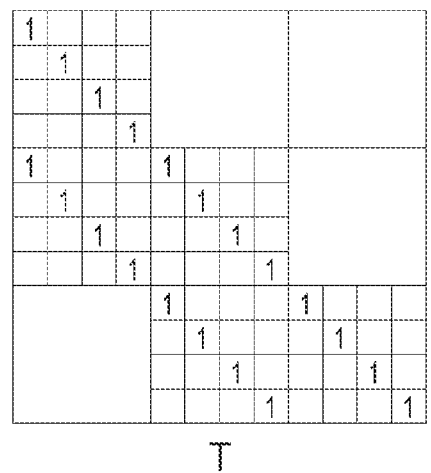
FIG. 8 is a view illustrating an example of a sub-block T constituting a parity check matrix and an inverse matrix thereof.
Figure 8:
Figure 8:
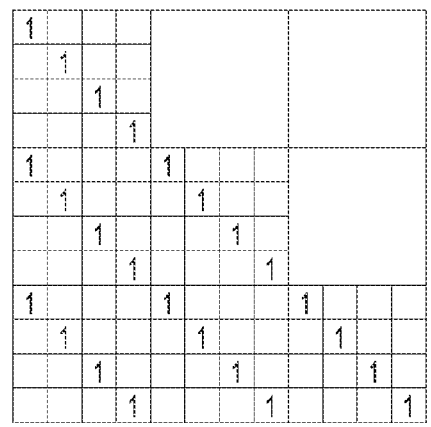

FIG. 8 is a view illustrating an example of a sub-block T constituting a parity check matrix and an inverse matrix $T^{-1}$ thereof.

Referring to FIG. 8, the sub-block T includes a plurality of Z*Z unit matrices arranged in a double diagonal structure. The inverse matrix $T^{-1}$ of the sub-block T may include a plurality of Z*Z unit matrices arranged in a lower triangular structure.

The multiplication result of the matrix having the lower triangular structure and a vector may generate linear simultaneous equations in a form that can be easily eliminated. For example, a calculation of obtaining each element of a second parity vector $p_2$ described with reference to Equation 2 may be expressed as the following Equation 5.

$$\begin{bmatrix} p_1 \\ p_2 \\ \cdots \\ p_k \end{bmatrix} = T^{-1} \begin{bmatrix} x_1 \\ x_2 \\ \cdots \\ x_k \end{bmatrix} \qquad <\text{Equation 5}>$$

In Equation 5, $$\begin{bmatrix} p_1 \\ p_2 \\ \cdots \\ p_k \end{bmatrix}$$

may be elements of the second parity vector $p_2$, and $$\begin{bmatrix} x_1 \\ x_2 \\ \cdots \\ x_k \end{bmatrix}$$

denotes elements of a vector X multiplied by a matrix $T^{-1}$, where $X=As+Bp_1$.

Referring to Equation 5 and FIG. 8, as a result of a matrix multiplication of the matrix $T^{-1}$, a plurality of simultaneous equations such as $p_1=x_1, \ldots, p_5=x_1+x_5, \ldots p_9=x_1+x_5+x_9, \ldots$ may be generated. The plurality of simultaneous equations may be generated in a form that can be easily eliminated, and the plurality of simultaneous equations may be eliminated to easily obtain elements of the second parity vector $p_2$ such as $p_1$, $p_5$, $p_9$.

Figure 9:
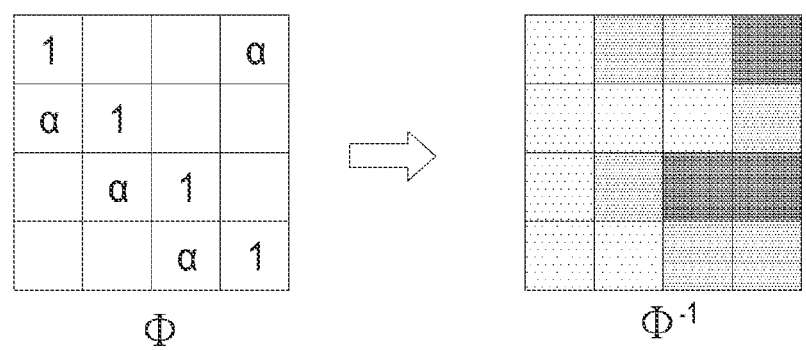
FIG. 9 is a view illustrating an example of a matrix Φ derived from a parity check matrix.

FIG. 9 is a view illustrating an example of a matrix $\Phi$ derived from a parity check matrix and an inverse matrix $\phi^{-1}$ thereof.

Referring to Equation 2 described above, $\phi=ET^{-1}B+D$ may be provided. The matrix $\phi$ derived based on sub-blocks B, T, D and E of a parity check matrix described with reference to FIG. 5 may have the same structure as illustrated in FIG. 9.

Referring to FIG. 9, in an example in which the sub-block D is $(1, \alpha)$, the matrix $\phi$ may have a form in which $(0, 1)+(1, \alpha)$, that is, a $Z*Z$ identity matrix, and a matrix obtained by cyclically shifting a $Z*Z$ identity matrix scaled to a to the left by 1 are combined.

The matrix $\phi$ may be a matrix in which the number of elements having a value other than '0' is sparse. FIG. 9 illustrates a case where $Z=4$, but when Z has a sufficiently large value such as 64, 256, or the like, elements having a value other than '0' in the matrix $\phi$ may be sparse as compared to elements having a value of '0'. On the other hand, unless the sparse matrix has a special structure such as a diagonal matrix, an inverse matrix of the sparse matrix may be a matrix in which the number of elements other than '0' is concentrated.

In an example of FIG. 9, a plurality of patterns illustrated in regions corresponding to entries of an inverse matrix $\phi^{-1}$ of the matrix $\phi$ conceptually indicate that the entries have elements of various values. When the matrix $\phi^{-1}$ is a dense matrix, the calculation complexity of a multiplication of the matrix $\phi^{-1}$ may increase.

However, in some implementations, the values of the elements of the matrix $\phi^{-1}$ derived based on the parity check matrix may have certain regularity. Accordingly, the calculation complexity of the multiplication of the matrix $\phi^{-1}$ may be reduced.

Specifically, the matrix $\phi^{-1}$ derived using a Gaussian elimination manner is given by the following Equation 6.

$$\phi^{-1} = \begin{bmatrix} \phi_1^{-1} \\ \phi_2^{-1} \\ \vdots \\ \phi_Z^{-1} \end{bmatrix} \text{ and } \phi_i^{-1} = [\phi_{i,1}^{-1}, \ldots, \phi_{i,Z}^{-1}]$$ <Equation 6>

In [Equation 6], each of $\phi_1^{-1}, \phi_2^{-1}, \ldots, \phi_z^{-1}$ may be vectors constituting a row of the matrix $\phi^{-1}$. A first element of $\phi_1^{-1}$ is $\phi_{1,1}^{-1}=\alpha^p$, and a last element thereof is $\phi_{1,Z}^{-1}=\alpha^{p+1}$, which may be determined as $\phi_{1,i}^{-1}=\alpha\phi_{1,i+1}^{-1}$ for $i=2, \ldots, Z-1$. Furthermore, it may be determined as $\phi_i^{-1}=\alpha\phi_{i-1}^{-1}+1_z(i)$. That is, there is a certain relationship between the vector $\phi_i^{-1}$ of an ith row in the matrix $\phi^{-1}$ and the vector $\phi_{i+1}^{-1}$ of an (i+1)th row.

Meanwhile, p may be given by the following Equation 7.

$$p = \text{find}(l \in \{0, 1, \ldots, Q-2\} \mid \alpha^l(\alpha^z + 1) = 1)$$ <Equation 7>

That is, p may be determined as an element satisfying $\alpha^l(\alpha^z+1)=1$ according to a sum-product operation defined in a Galois field GF(Q), among elements in a set determined based on a field size Q of the Galois field GF(Q). Here, Z may represent a size of a sub-matrix constituting a parity check matrix of NBQC-LDPC.

Meanwhile, in an example in which a sub-block D is $(1, \alpha)$, values of p according to the size Z and the field size Q of the sub-matrix may be summarized as illustrated in Table 1 below.

TABLE 1

| | Q | | | | | | |
|---|---|---|---|---|---|---|---|
| Z | 4 | 8 | 16 | 32 | 64 | 128 | 256 |
| 4 | 1 | 2 | 14 | 21 | 39 | 99 | 114 |
| 8 | 2 | 3 | 6 | 9 | 15 | 71 | 228 |
| 16 | 1 | 1 | 11 | 7 | 29 | 15 | 201 |
| 32 | 2 | 2 | 7 | 13 | 60 | 30 | 147 |
| 64 | 1 | 3 | 14 | 26 | 57 | 60 | 39 |
| 128 | 2 | 1 | 13 | 21 | 51 | 120 | 78 |
| 256 | 1 | 2 | 11 | 9 | 39 | 113 | 156 |

Based on a relationship between the rows of the matrix $\phi^{-1}$, a vector p as a result of a multiplication of the matrix $\phi^{-1}$ and the vector X can be summarized as the following Equation 8.

$$p = \phi^{-1}x \Rightarrow \begin{bmatrix} p_1 \\ p_2 \\ \vdots \\ p_Z \end{bmatrix} = \begin{bmatrix} \phi_{1,1}^{-1} & \phi_{1,2}^{-1} & \cdots & \phi_{1,Z}^{-1} \\ \phi_{2,1}^{-1} & \phi_{2,2}^{-1} & \cdots & \phi_{2,Z}^{-1} \\ \vdots & \vdots & \ddots & \vdots \\ \phi_{Z,1}^{-1} & \phi_{Z,2}^{-1} & \cdots & \phi_{Z,Z}^{-1} \end{bmatrix} \begin{bmatrix} x_1 \\ x_2 \\ \vdots \\ x_Z \end{bmatrix} \Rightarrow$$ <Equation 8>

$$\begin{cases} p_1 = \phi_{1,1}^{-1}x_1 + \cdots + \phi_{1,Z}^{-1}x_Z \\ p_2 = \alpha p_1 + x_2 \\ \vdots \\ (p_i)_Z = \alpha p_{Z-1} + x_Z \end{cases}$$

Referring to Equation 8, from a second element of a vector p, it may be expressed as a simple relational expression with a preceding element. When a calculation for a first element $p_1$ among the elements of the vector p is completed, the remaining elements may be calculated based on calculation results of the preceding element.

Figure 10:
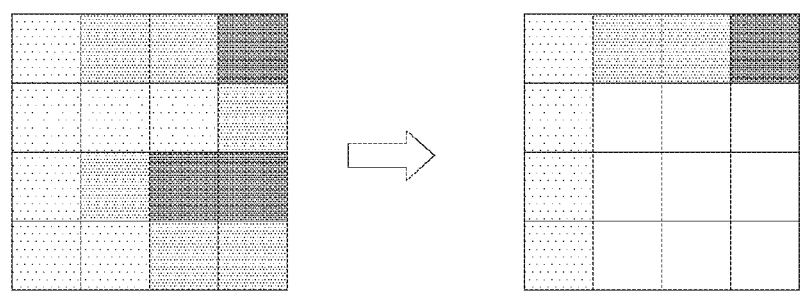
FIG. 10 is a view conceptually illustrating an example of a calculation amount of a multiplication of a matrix $\Phi^{-1}$ and a vector.

FIG. 10 is a view conceptually illustrating a calculation amount of a multiplication of a matrix $\Phi^{-1}$ and a vector.

As described with reference to FIG. 9, the matrix $\phi^{-1}$ may be a dense matrix in which entries have various values. However, as described above, in order to perform the multiplication of the matrix $\phi^{-1}$ and the vector, when a calculation on the first element is completed, a calculation of the remaining elements may be calculated based on the calculation results of the preceding element.

FIG. 10 conceptually illustrates a calculation amount required for a multiplication of the matrix $\phi^{-1}$ and the vector. Referring to FIG. 10, in order to determine a value of the first element of the vector p, all elements of the first row of the matrix $\phi^{-1}$ may be calculated. On the other hand, in order to calculate the remaining elements, elements included in a row of the matrix $\phi^{-1}$ need not be calculated. For example, even if Z has a large value such as 64, 256, or the like, when a value of one element is determined, the values of the remaining elements may be determined according to the value of the preceding element. Accordingly, the calculation amount of the multiplication of the matrix $\phi^{-1}$ may be reduced.

In some implementations, since a calculation amount of a multiplication of inverse matrices ($T^{-1}$, $\phi^{-1}$) may be reduced, the calculation complexity of an NBQC-LDPC encoding calculation involving the multiplication of the inverse matrices ($T^{-1}$, $\phi^{-1}$) is reduced. A structure of an NBQC-LDPC encoder for performing the NBQC-LDPC encoding calculation may also be simplified. Hereinafter, referring to FIGS. 11 and 12, a structure of the NBQC-LDPC encoder will be described.

Figure 11:
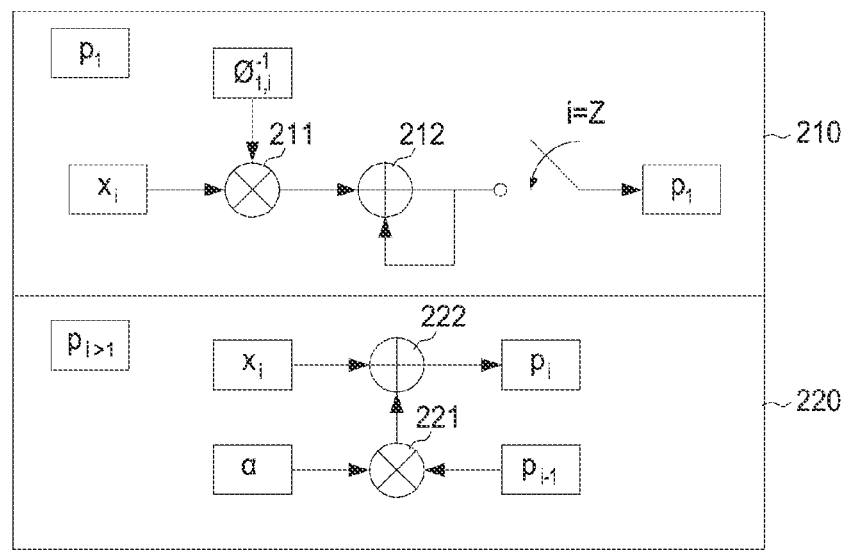
FIG. 11 is a view illustrating an example of a multiplier of a matrix $\Phi^{-1}$.

FIG. 11 is a view illustrating an example multiplier of a matrix $\Phi^{-1}$.

Referring to FIG. 11, a multiplier 200 for multiplying a matrix $\phi^{-1}$ and a vector X includes a first calculation unit 210 for calculating a first element $p_1$ and a second calculation unit 220 for calculating the remaining elements.

The first calculation unit 210 may include a multiplier 211 for performing a multiplication of an ith element $x_i$ of the vector X and an element $\phi_{1,i}^{-1}$ of a first row of the matrix $\phi^{-1}$, and an adder 212 for accumulating calculation results of the multiplier 211 from when i is from 1 to Z.

The second calculation unit 220 includes a multiplier 221 for performing a multiplication of a preceding element ($p_{i-1}$) of a vector p and $\alpha$, and an adder 222 for calculating an ith element $p_i$ of the vector p by adding an ith element $x_i$ of a vector x to multiplication results of the multiplier 221.

In some implementations, the multiplier 200 includes only the multiplier 221 and the adder 222 for performing one multiplication and one addition calculation so as to calculate an element after a second element of the vector p, thereby simplifying a structure of the multiplier 200.

Figure 12:
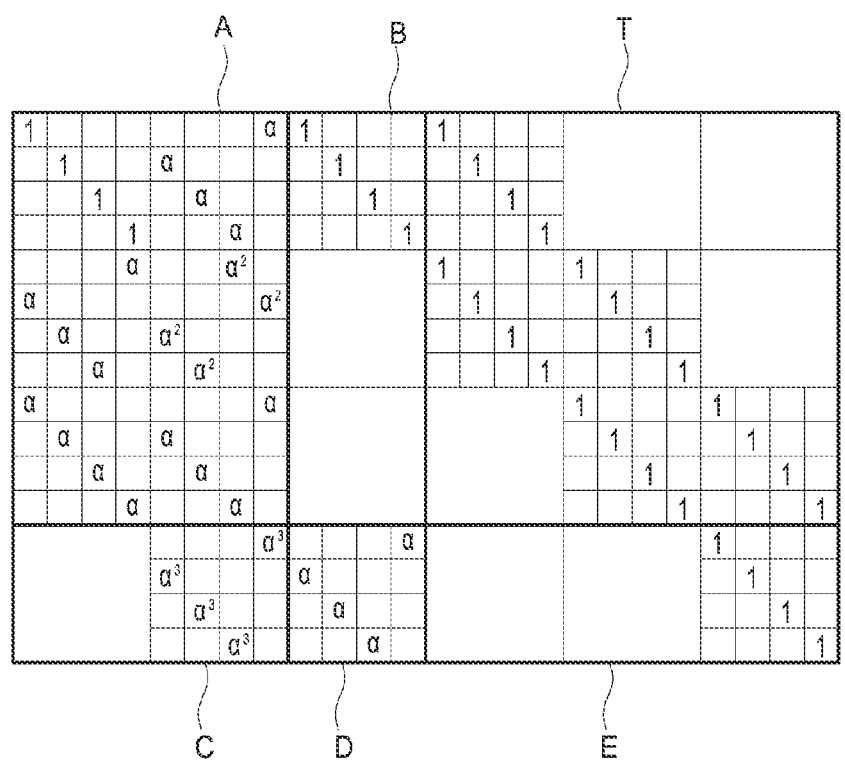
FIGS. 12 and 13 are views illustrating examples of a structure of an LDPC encoder.
Figure 13:
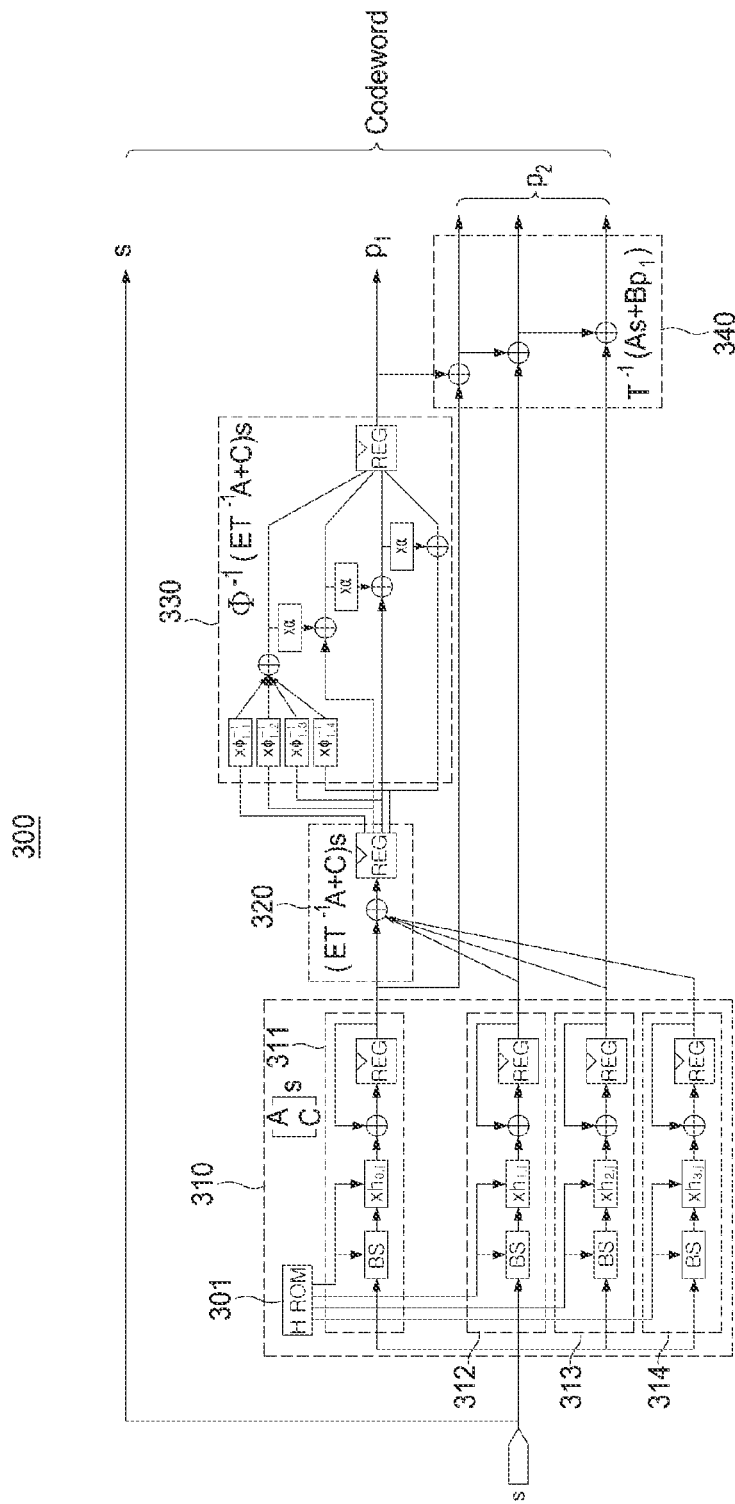

FIGS. 12 and 13 are diagrams illustrating examples of a structure of an LDPC encoder. FIG. 12 illustrates an example of a parity check matrix of an NBQC-LDPC code, and FIG. 13 illustrates an example structure of an LDPC encoder based on the parity check matrix of FIG. 12.

Referring to FIG. 12, the parity check matrix includes a plurality of Z*Z sub-matrices. The parity check matrix may include m rows and n columns comprised of sub-matrices. In an example of FIGS. 12, Z=4, m=4, and n=6 may be provided. However, in the present disclosure, the number and size of the sub-matrices of the parity check matrix are not limited.

The parity check matrix may include sub-blocks A, B, T, C, D and E. The sub-blocks B, T, D and E constituting the parity part matrix may have the same structure as described with reference to FIG. 5. Furthermore, the sub-blocks A and C constituting an information part matrix may include sub-matrices, each of which is a scaled cyclic identity matrix. The scaled cyclic identity matrix may refer to a matrix in which elements of the identity matrix are shifted and the shifted elements are multiplied by elements of the Galois field. The structure of the sub-blocks A and C illustrated in FIG. 12 is merely an example, and a structure of sub-matrices included in the sub-blocks A and C may be changed.

Referring to FIG. 13, when an information vector s is input, an LDPC encoder 300 may generate first and second parity vectors ($p_1$, $p_2$) through an LDPC encoding calculation and output a codeword including the information vector s and the first and second parity vectors ($p_1$, $p_2$). The LDPC encoder 300 may be implemented to generate the first and second parity vectors ($p_1$, $p_2$) based on Equation 2 described above.

The LDPC encoder 300 may include first to fourth calculation blocks 310 to 340.

The first calculation block 310 may perform a multiplication of an information part matrix including the sub-blocks A and C and the information vector s. Hereinafter, the information part matrix included in the parity check matrix of FIG. 12 may be expressed as the following Equation 9.

$$\begin{bmatrix} A \\ C \end{bmatrix} = \begin{bmatrix} H_{1,1} & H_{1,2} \\ H_{2,1} & H_{2,2} \\ H_{3,1} & H_{3,2} \\ H_{4,1} & H_{4,2} \end{bmatrix} \qquad \text{<Equation 9>}$$

In Equation 9, $H_{i,j}$ may represent a sub-matrix at an ith row and a jth column in the information part matrix, respectively.

In some implementations, the first calculation block 310 includes m row calculation units 311 to 314 corresponding to each row of the parity check matrix.

The row calculation units 311 to 314 may perform a multiplication of an information part matrix having k sub-matrices at each of m rows and an information vector, respectively. Specifically, for each of k sub-matrices included in corresponding rows, each of the row calculation units 311 to 314 may accumulate multiplication results for a target sub-matrix and elements corresponding to the target sub-matrix, thereby performing a multiplication of the k sub-matrices and the information vector.

For example, the first row calculation unit 311 performs a multiplication of an information vector s and sub-matrices $[H_{1,1}\ H_{1,2}]$ corresponding to a first row of the parity check matrix. When the information vector has eight elements of $s_1, s_2, s_3, s_4, s_5, s_6, s_7, s_8$, the multiplication of the sub-matrices and the information vector s may be calculated as illustrated in the following Equation 10.

$$[H_{1,1}\ H_{1,2}]s = \begin{bmatrix} 1 & 0 & 0 & 0 \\ 0 & 1 & 0 & 0 \\ 0 & 0 & 1 & 0 \\ 0 & 0 & 0 & 1 \end{bmatrix}\begin{bmatrix} s_1 \\ s_2 \\ s_3 \\ s_4 \end{bmatrix} + \begin{bmatrix} 0 & 0 & 0 & \alpha \\ \alpha & 0 & 0 & 0 \\ 0 & \alpha & 0 & 0 \\ 0 & 0 & \alpha & 0 \end{bmatrix}\begin{bmatrix} s_5 \\ s_6 \\ s_7 \\ s_8 \end{bmatrix} \qquad \text{<Equation 10>}$$

The first row calculation unit 311 may sequentially calculate $$\begin{bmatrix} 1 & 0 & 0 & 0 \\ 0 & 1 & 0 & 0 \\ 0 & 0 & 1 & 0 \\ 0 & 0 & 0 & 1 \end{bmatrix}\begin{bmatrix} s_1 \\ s_2 \\ s_3 \\ s_4 \end{bmatrix}$$

and $$\begin{bmatrix} 0 & 0 & 0 & \alpha \\ \alpha & 0 & 0 & 0 \\ 0 & \alpha & 0 & 0 \\ 0 & 0 & \alpha & 0 \end{bmatrix}\begin{bmatrix} s_5 \\ s_6 \\ s_7 \\ s_8 \end{bmatrix},$$

and may generate a multiplication result of the sub-matrices and the information vector s by accumulating the calculation results.

A first row calculation unit 311 comprises a special structure for performing a multiplication of a shifted cyclic identity matrix. For example, the first row calculator 311 may include a barrel shifter BS configured to shift elements corresponding to the target sub-matrix to a degree to which the target sub-matrix as a shifted cyclic identity is shifted, a multiplier ($\times h_{0,j}$) configured to multiply the shifted elements by elements of the Galois field multiplied by the target sub-matrix, and a register unit REG configured to accumulate results of a multiplication generated by the barrel shifter BS and the multiplier ($\times h_{0,j}$) for each of the k sub-matrices.

Similarly, the second to fourth row calculation units 312 to 314 may calculate [$H_{2,1}$ $H_{2,2}$]s, [$H_{3,1}$ $H_{3,2}$]s, and [$H_{4,1}$ $H_{4,2}$]s, respectively.

A second calculation block 320 generates a calculation result of ($ET^{-1}A+C$)s by accumulating the calculation results of the first calculation block 310. ($ET^{-1}A+C$)s may be referred to as an output vector.

Referring to the parity check matrix of FIG. 12, $ET^{-1}$ may be determined as the following Equation 11.

$$ET^{-1} = [(-1, 0) \; (-1, 0) \; (0, 1)] \begin{bmatrix} (0,1) & (-1,0) & (-1,0) \\ (0,1) & (0,1) & (-1,0) \\ (0,1) & (0,1) & (0,1) \end{bmatrix} = [(0,1) \; (0,1) \; (0,1)] \quad \text{Equation 11}$$

In Equation 11, (−1, 0) may indicate a Z*Z zero matrix, and (0, 1) may indicate a Z*Z identity matrix. By organizing ($ET^{-1}A+C$)s based on $ET^{-1}=[(0,1) \; (0,1) \; (0,1)]$, a result of accumulating the calculation results of the row calculation units 311 to 314 may be derived. Specifically, it may be $ET^{-1}As=[H_{1,1} \; H_{1,2}]s+[H_{2,1} \; H_{2,2}]s+[H_{3,1} \; H_{3,2}]s$, and $Cs=[H_{4,1} \; H_{4,2}]s$. Accordingly, ($ET^{-1}A+C$)s may be summarized as the following Equation 12.

$$(ET^{-1}A + C)s = \qquad \text{<Equation 12>}$$
$$[H_{1,1} + H_{2,1} + H_{3,1} + H_{4,1}, \; H_{1,2} + H_{2,2} + H_{3,2} + H_{4,2}]s$$

A third calculation block 330 calculates a first parity vector $p_1=\phi^{-1}(ET^{-1}A+C)s$ by applying multiplication of an inverse matrix ($\phi^{-1}$) to an output vector of the second calculation block 320. When the vector X is defined according to the following Equation 13, the first parity vector $p_1$ may be calculated in the same manner as described with reference to FIGS. 10 and 11.

$$x = \begin{bmatrix} x_1 \\ x_2 \\ x_3 \\ x_4 \end{bmatrix} = (ET^{-1}A + C)s \qquad \text{<Equation 13>}$$

The third calculation block 330 calculates a first element of the first parity vector $p_1$ and calculates the remaining elements in a chain based on a calculation result of the first element.

Specifically, the third calculation block 330 may include Z multipliers configured to multiply the first element of the output vector by $\alpha^p$, multiply a last element of the output vector by $\alpha^{p+1}$, and multiply oil having a relationship of $\phi_{1,i}^{-1}=\alpha\phi_{1,i+1}^{-1}$ with respect to an ith element (i=2, ..., Z−1) of the output vector, and an adder configure to output a value of the first element of the first parity vector by adding the calculation results from the Z multipliers.

Furthermore, the third calculation block 330 may include multipliers configured to perform a multiplication of $\alpha$ with a preceding element ($p_{i-1}$) and $\alpha$, with respect to the ith elements (i=2, ..., Z) of the first parity vector $p_1$, and adders configured to calculate an ith element ($p_i$) of a vector p by adding an ith element ($x_i$) of a vector x to multiplication results of each of the multipliers.

The third calculation block 330 may output calculation results of each element as the first parity vector $p_1$.

The fourth calculation block 340 may calculate a second parity vector $p_2=T^{-1}(As+Bp_1)$ based on the calculation results of the first calculation block 310 and the third calculation block 330. As described with reference to FIG. 8, the matrix $T^{-1}$ may have a lower triangular structure. Accordingly, $T^{-1}As$ and $T^{-1}Bp_1$ may be calculated as illustrated in the following Equation 14.

$$T^-As = \begin{bmatrix} H_{1,1} & H_{1,2} \\ H_{1,1} + H_{2,1} & H_{1,2} + H_{2,2} \\ H_{1,1} + H_{2,1} + H_{3,1} & H_{1,2} + H_{2,2} + H_{3,2} \end{bmatrix} s, \qquad \text{<Equation 14>}$$

$$T^{-1}Bp_1 = \begin{bmatrix} (0,1) \\ (0,1) \\ (0,1) \end{bmatrix} p_1$$

The adders of the fourth calculation block 340 may accumulate results from the first row calculation units 311, 312 and 313 and may output the second parity vector $p_2$ by adding the first parity vector $p_1$ from the third calculation block 330.

Referring to FIG. 4, the second parity vector may have (m−1)*Z elements. The second parity vector $p_2$ may be defined as a vector including (m−1) partial vectors each having continuous Z elements.

Referring to FIG. 13 and the equation 14, the fourth calculation block 340 may determine a first partial vector of the second parity vector $p_2$ by adding the output of a first row of the first calculation block 310 and the first parity vector $p_1$. Further, the fourth calculation 340 may determine a jth partial vector (j=2, ..., Z) of the second parity vector $p_2$ by adding a jth row of the first calculation block 310 and a (j−1)th partial vector of the second parity vector $p_2$.

Referring to the LDPC encoder 300 described with reference to FIG. 13, matrix multiplications related to the matrix $T^{-1}$ may be simply processed in an addition calculation of the matrix. Furthermore, in the matrix multiplication related to the matrix $T^{-1}$, the calculation results of the remaining elements of the first parity vector may be obtained based on a simple cumulative sum-product operation with respect to the calculation results of the first element of the first parity vector. Accordingly, the structure of the LDPC encoder 300 for performing NBQC-LDPC encoding may be simplified. When the structure of the LDPC encoder 110 is simplified, a circuit region constituting the LDPC encoder 300 may be reduced, and the power consumption of the LDPC encoder 300 may be reduced.

The NBQC-LDPC encoder based on the parity check matrix may be applied to a storage device including a nonvolatile memory device.

Figure 14:
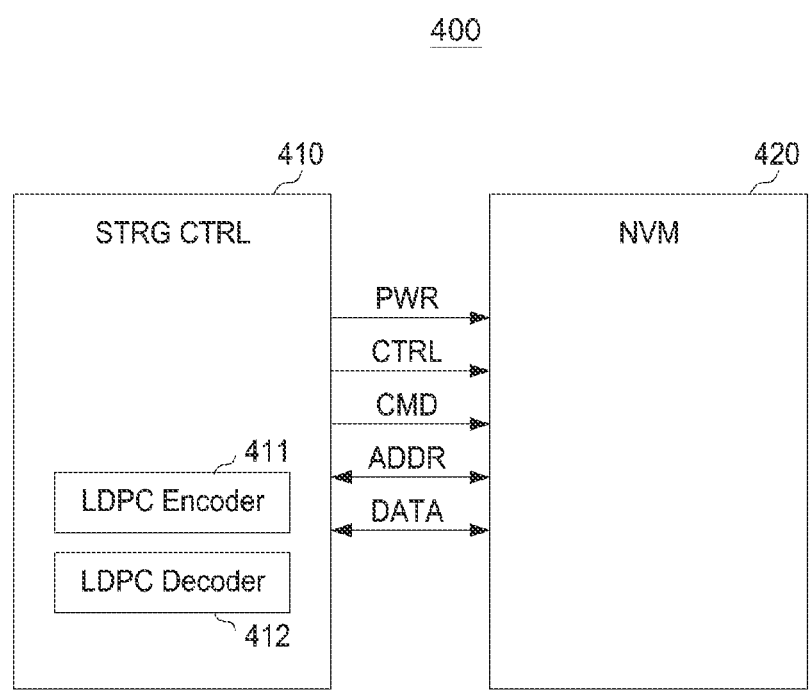
FIG. 14 is a view illustrating an example of a storage device.

FIG. 14 is a view illustrating an example of a storage device 400.

The storage device 400 includes a storage controller 410 and a nonvolatile memory device 420.

The storage device 400 may include storage media for storing data according to a request from an external host. For example, the storage device 400 may include at least one of a solid state drive (SSD), an embedded memory, and a removable external memory. When the storage device 400 is the SSD, the storage device 400 may be a device that complies with a non-volatile memory express (NVMe) standard. When the storage device 400 is the embedded memory or the external memory, the storage device 400 may be a device that complies with a universal flash storage (UFS) or embedded multi-media card (eMMC) standard.

The nonvolatile memory device 420 may maintain stored data even when power is not supplied. The nonvolatile memory device 420 may store data provided from a host through a program operation, and may output data stored in the nonvolatile memory device 420 through a read operation.

When the nonvolatile memory device 420 includes a flash memory, the flash memory may include a 2D NAND memory array or a 3D (or vertical) NAND (VNAND) memory array. As another example, the storage device 400 may include various other types of nonvolatile memories. For example, a magnetic RAM (MRAM), a spin-transfer torque MRAM, a conductive bridging RAM (CBRAM), a ferroelectric RAM (FeRAM), a phase RAM (PRAM), a resistive memory, and other types of memory may be applied to the storage device 400.

The storage controller 410 may control the nonvolatile memory device 420 in response to a request from the host. For example, the storage controller 410 may provide data read from the nonvolatile memory device 420 to the host, and may store the data provided from the host in the nonvolatile memory device 420. For this operation, the storage controller 410 may support operations such as read, program, and erase of the nonvolatile memory device 420.

The storage controller 410 and the nonvolatile memory device 420 may be integrated into one semiconductor device to form a memory card. For example, the storage controller 410 and the nonvolatile memory device 420 may be integrated into a single semiconductor device to form PC cards (personal computer memory card international association (PCMCIA)), compact flash cards (CF), smart media cards (SM, SMC), memory sticks, multimedia cards (MMC, RS-MMC, MMC micro), SD cards (SD, miniSD, microSD, SDHC), and universal flash storage (UFS).

The nonvolatile memory device 420 may perform erase, write, and read operations under the control of the storage controller 410. The nonvolatile memory device 420 may receive commands (CMD), addresses (ADDR), and data (DATA) from a storage controller 210 through input and output lines. Furthermore, the non-volatile memory device 420 may receive power PWR from the storage controller 410 through a power line and may receive a control signal CTRL from the storage controller 410 through a control line. The control signal CTRL may include a command latch enable (CLE), an address latch enable (ALE), a chip enable (nCE), a write enable (nWE), and a read enable (nRE).

The storage controller 410 may control an overall operation of the nonvolatile memory device 420. The storage controller 410 may include an LDPC encoder 411 for NBQC-LDPC encoding and an LDPC decoder 412 for NBQC-LDPC decoding.

The LDPC encoder 411 may generate a codeword to which a parity bit is added, by performing the NBQC-LDPC encoding on data to be programmed in the nonvolatile memory device 420. The codeword may be stored in the nonvolatile memory device 420. The codeword stored in the nonvolatile memory device 420 may be distorted over time, and the distorted codeword may include error bits.

The LDPC decoder 412 may perform the NBQC-LDPC decoding on data read from the nonvolatile memory device 420. The read data may be a codeword including the error bits. The LDPC decoder 412 may determine whether the NBQC-LDPC decoding is successful and may output an indication signal according to the determination results.

In some implementations, the LDPC encoder 411 and the LDPC decoder 412 perform NBQC-LDPC encoding and NBQC-LDPC decoding operations using the parity check matrix described with reference to FIG. 5. Specifically, the LDPC encoder 411 may include the LDPC encoder 300 as described with reference to FIG. 13.

In the sub-blocks B, T, D and E forming the parity part matrix of the parity check matrix of the NBQC-LDPC code, the sub-block T may have identity matrices arranged in a double diagonal structure, the sub-matrix B may have a first sub-matrix that is an identity matrix, and the sub-block E may have a last sub-matrix that is an identity matrix. Furthermore, the sub-block D may have a sub-matrix in which positions of each element of an identity matrix scaled to a are shifted to the left by one place.

Due to the structure of the sub-block D, each element of the parity part matrix may be closely connected in a single cycle, thereby improving the error correction performance of the NBQC-LDPC code using the parity check matrix. Furthermore, since an inverse matrix multiplication of the matrix $\phi$ may have regularity, the structure of the NBQC-LDPC encoder using the parity check matrix and the complexity of the NBQC-LDPC encoding calculation may be reduced.

In some implementations, the storage device 400 may quickly encode and decode data using parallel processing, thereby improving data input/output performance. Furthermore, the reliability of the storage device 400 may be improved due to the high error correction performance, and the power consumption of the storage device 400 may be reduced due to the reduction of computational complexity.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. An LDPC encoder comprising:
   a first calculation circuit configured to perform a multiplication of an information vector and an information part matrix having sub-matrices at each of m rows and k columns, in a parity check matrix, wherein m and k are natural numbers;
   a second calculation circuit configured to generate an output vector by adding outputs of each of m rows of the first calculation circuit;
   a third calculation circuit configured to determine a first element of a first parity vector by performing a predetermined sum-product operation on each element of the output vector, perform an operation of determining an ith element of the first parity vector by multiplying an (i−1)th element of the first parity vector by an element α of a Galois field and adding an ith element of the output vector thereto, for a second element to a last element of the first parity vector, respectively, and output a first parity vector constituting a codeword together with the information vector, wherein i is a natural number, and a fourth calculation circuit configured to determine a first partial vector of a second parity vector by adding an output of a first row of the first calculation circuit and an output of the first parity vector, perform an operation of adding an output of a jth row of the first calculation circuit to a (j−1)th partial vector of the second parity vector, for a second partial vector to a last partial vector of the second parity vector, respectively, and output a second parity vector constituting the codeword, wherein j is a natural number.

2. The LDPC encoder of claim 1, wherein the first calculation circuit comprises:

m row calculation units for performing a multiplication calculation of k sub-matrices at different ones of the m rows, and the information vector, wherein each of the m row calculation units is configured to, for each of k sub-matrices, perform a multiplication of the k sub-matrices and the information vector by accumulating multiplication calculation results for a target sub-matrix and elements corresponding to the target sub-matrix.

3. The LDPC encoder of claim 2, wherein each of the k sub-matrices is a scaled cyclic matrix obtained by shifting elements of an identity matrix and multiplying the shifted elements by an element of the Galois field, wherein each of the m row calculations comprises:

a barrel shifter configured to shift elements corresponding to the target sub-matrix to a degree at which the target sub-matrix is shifted, a multiplier configured to multiply the shifted elements by an element of the Galois field multiplied by the target sub-matrix, and a register configured to accumulate multiplication results generated from the barrel shifter and the multiplier for each of the k sub-matrices.

4. The LDPC encoder of claim 1, wherein the third calculation circuit comprises:

Z multipliers configured to multiply a first element of the output vector by $\alpha^p$, multiply a last element of the output vector by $\alpha^{p+1}$, and multiply $\phi_{1,i}^{-1}$ of having a relationship of $\phi_{1,i}^{-1} = \alpha \phi_{1,i+1}^{-1}$, with respect to ith elements (i=2, . . . , Z−1), and an adder configured to output a value of a first element of the first parity vector by adding calculation results from the Z multipliers.

5. The LDPC encoder of claim 1, wherein the parity check matrix comprises:

a sub-block A having sub-matrices each at (m−1) rows and k columns and a sub-block C having sub-matrices each at one row and k columns included in the information part matrix; and a sub-block B having sub-matrices each at (m−1) rows and one column, a sub-block T having sub-matrices each at (m−1) rows and (m−1) columns, a sub-block D having a sub-matrix, and a sub-block E having sub-matrixes each at one row and (m−1) columns included in a parity part matrix having sub-matrices each at m rows and m columns, wherein the sub-blocks included in the parity check matrix, the sub-blocks included in the information vector, the first parity vector, and the second parity vector have a relationship of the following equation $$\begin{cases} p_1 = \phi^{-1}(ET^{-1}A + C)s, \phi = ET^{-1}B + D \\ p_2 = T^{-1}(As + Bp_1) \end{cases}$$

wherein $p_1$ is the first parity vector, $p_2$ is the second parity vector, s is the information vector, A, B, T, C, D and E are the sub-block A, the sub-block B, the sub-block T, the sub-block C, the sub-block D, and the sub-block E, respectively.

6. The LDPC encoder of claim 5, wherein the first calculation circuit is configured to perform a multiplication calculation $$\begin{bmatrix} A \\ C \end{bmatrix}$$

of the information part matrix and the information vector, where A and C are the sub-block A and the sub-block C, respectively, and s is the information vector.

7. The LDPC encoder of claim 5, wherein the second calculation circuit is configured to perform a calculation of $(ET^{-1}A+C)s$, where A, C and E are the sub-block A, the sub-block C, and the sub-block E, respectively, and $T^{-1}$ is an inverse matrix of the sub-block T, and s is the information vector.

8. The LDPC encoder of claim 7, wherein the third calculation circuit is configured to output the first parity vector by performing a calculation of $P_1=\Phi^{-1}(ET^{-1}A+C)s$, where $p_1$ is the first parity vector, $\phi^{-1}$ is an inverse matrix of $(ET^{-1}B+D)$, and B, D and E are the sub-block B, the sub-block D, and the sub-block E, respectively.

9. The LDPC encoder of claim 8, wherein the fourth calculation circuit is configured to output $p_2$ by performing a calculation of $p_2=T^{-1}(As+Bp_1)$, where $p_2$ is the first parity vector.

10. An LDPC encoding method comprising:

in a parity check matrix, performing, using a first calculation circuit, a multiplication calculation of an information vector and an information part matrix having k sub-matrices at each of m rows, wherein m and k are natural numbers;

generating, using a second calculation circuit, an output vector by adding results for each of the m rows, included in multiplication calculation results of the information part matrix and the information vector;

determining, using a third calculation circuit, a first element of a first parity vector by performing a predetermined sum-product operation on each of elements of the output vector;

performing, using a third calculation circuit, an operation of determining an ith element of the first parity vector by multiplying an (i−1)th element of the first parity vector by an element α of a Galois field and adding an ith element of the output vector thereto, for a second element to a last element of the first parity vector, respectively, wherein i is a natural number;

determining, using a fourth calculation circuit, a first partial vector of a second parity vector by adding an output of a first row of the multiplication calculation results and an output of the first parity vector;

performing, using the fourth calculation circuit, an operation of adding an output of a jth row of the multiplication calculation results to a (j−1)th partial vector of the second parity vector, for a second partial vector to a last partial vector of the second parity vector, wherein j is a natural number; and outputting the information vector, the first parity vector, and the second parity vector as codewords.

\* \* \* \* \*